United States Patent
Weng et al.

(10) Patent No.: US 8,604,510 B2
(45) Date of Patent: Dec. 10, 2013

(54) LIGHT-EMITTING DIODE MOUNTED ON INTERSECTED AND DISCONTINUOUS TRANSPARENT CONDUCTIVE PATTERN LAYERS AND MANUFACTURING METHOD THEREOF

(71) Applicants: Ssu-Yuan Weng, New Taipei (TW); Yu-Huan Liu, New Taipei (TW)

(72) Inventors: Ssu-Yuan Weng, New Taipei (TW); Yu-Huan Liu, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 0 days.

(21) Appl. No.: 13/649,348

(22) Filed: Oct. 11, 2012

(65) Prior Publication Data
US 2013/0032850 A1 Feb. 7, 2013

Related U.S. Application Data

(62) Division of application No. 12/781,803, filed on May 17, 2010, now abandoned.

(30) Foreign Application Priority Data

Nov. 25, 2009 (TW) ................................ 98140165 A (51) Int. Cl.
| | |
|---|---|
| H01L 33/00 | (2010.01) |
| H01L 27/15 | (2006.01) |
| H01L 29/267 | (2006.01) |
| H01L 31/12 | (2006.01) |
| H01L 21/00 | (2006.01) |
| F21V 3/00 | (2006.01) |
| F21V 5/00 | (2006.01) |

(52) U.S. Cl.
USPC .......... 257/99; 257/81; 257/E33.064; 438/26; 362/311.02

(58) Field of Classification Search
None
See application file for complete search history.

(56) References Cited

U.S. PATENT DOCUMENTS

| | | | |
|---|---|---|---|
| 6,270,236 | B1 | 8/2001 | Brussog |
| 6,548,956 | B2 * | 4/2003 | Forrest et al. ................. 313/504 |
| 6,667,497 | B1 | 12/2003 | Huang et al. |
| 8,232,573 | B2 * | 7/2012 | Lin et al. ......................... 257/98 |
| 2006/0029326 | A1 | 2/2006 | Ouchi |
| 2008/0176398 | A1 | 7/2008 | Jain et al. |

FOREIGN PATENT DOCUMENTS

TW 200847114 12/2008

* cited by examiner

*Primary Examiner* — Michael Jung
(74) *Attorney, Agent, or Firm* — Han IP Corporation (57) ABSTRACT

A light-emitting diode (LED) and manufacturing method thereof are disclosed. The LED includes a transparent substrate, a plurality of transparent conductive layers, a plurality of metal circuits, and a LED chip. The LED chip is suitable for emitting a light and a portion of the light emits toward the transparent substrate. The manufacturing method of LED includes the following steps. First, a transparent conductive layer is formed on the transparent substrate. Next, a conductive pattern is formed by etching transparent conductive layer. The intersection metal circuit is formed by disposing the metal on a portion of the transparent conductive layer. Finally, the LED chip is disposed on the metal circuit so that the LED chip is electrically connected to the metal circuit.

17 Claims, 10 Drawing Sheets

LIGHT-EMITTING DIODE MOUNTED ON INTERSECTED AND DISCONTINUOUS TRANSPARENT CONDUCTIVE PATTERN LAYERS AND MANUFACTURING METHOD THEREOF

CROSS-REFERENCE TO RELATED APPLICATIONS

This application is a divisional application of U.S. patent application Ser. No. 12/781,803, filed on May 17, 2010, which claims the priority benefit of Taiwan Patent Application No. 98140165, filed on Nov. 25, 2009. The above-identified applications are herein incorporated by reference in their entirety.

BACKGROUND

1. Technical Field

The present invention relates to a light emitting diode (LED) and a manufacturing method thereof. More particularly, the present invention relates to a light emitting diode with double-side emission and a manufacturing method thereof.

2. Description of Related Art

Due to advantages of low power consumption and small volume, LEDs have been extensively applied to fabrication of different sized array light emitting module and applied in indicators in information, communication and consumptive electronic appliances and display devices.

The light emitting module with double-side emission can be applied in the electronic devices, such as LED advertisement display screens or flip-open type cell phones. The light emitting module with double-side emission may achieve the goal of reducing the manufacturing costs, weight and thickness by using a panel with double-side emission.

No matter the conventional packaging process of the LED module using the single LED package, the surface-mount device or the flip-chip package, the finished products requires soldering on the printed circuit board to connect the electronic circuit structure in the final steps. However, the light emitting chip is fixed on the non-transparent printed circuit board, and the goal of the double-side emission cannot be accomplished.

In addition, a light emitting module can have a plurality of LED dies with different color, simultaneously. Taking the white LED module of the backlight module as an example, because the white LED module is made with red, green and blue LEDs, the epitaxial materials of different color die are difference, and further the voltage characteristics are difference and the design of the control circuit is more complex.

Therefore, since the light emitting module requires a complex circuit design to satisfy the demand, the LED module and packaging method thereof can be achieved the goal of double-side emission.

SUMMARY

The present invention provides a light-emitting diode with double-side emission and a manufacturing method thereof.

According to one aspect, an LED device may comprise a transparent substrate, a transparent conductive pattern layer disposed on the transparent substrate, a first metal circuit and a second metal circuit disposed on the transparent conductive pattern layer and intersecting with each other, an insulating layer disposed on a portion of the first metal circuit and extended to cover a portion of the second metal circuit, a connecting section disposed on a portion of the insulating layer and connected to the second metal circuit, and an LED chip electrically connected to the first metal circuit and the second metal circuit. The second metal circuit may be discontinuous by the first metal circuit. The second metal circuit and the first metal circuit may be electrically isolated from each other. The LED chip may emit a light at least a portion of which is emitted toward the transparent substrate.

In at least some embodiments, the transparent substrate may comprise a glass substrate, a plastic substrate, or a flexible substrate.

In at least some embodiments, a material of the transparent conductive pattern layer may comprise indium tin oxide.

In at least some embodiments, a material of the first metal circuit or the second metal circuit may comprise gold, aluminum, copper, or an alloy thereof.

In at least some embodiments, a material of the insulating layer may comprise silicon oxide or nitride dioxide.

In at least some embodiments, the LED chip may be electrically connected to an electrode extending from the first metal circuit and an electrode extending from the second metal circuit.

In at least some embodiments, the LED chip may be electrically connected to the first metal circuit and the second metal circuit by flip chip.

According to another aspect, a manufacturing method of an LED may comprise: forming a transparent conductive pattern layer on a transparent substrate; forming a first metal circuit and a second circuit on the transparent conductive pattern layer such that the second metal circuit and the first metal circuit intersect with each other and are electrically isolated from each other, wherein the second metal circuit is discontinuous by the first metal circuit; depositing an insulating layer on a portion of the first metal circuit, which extends to cover a portion of the second metal circuit; depositing a connecting section on a portion of the insulating layer and connected to the second metal circuit; and electrically connecting a LED chip to the first metal circuit and the second metal circuit.

In at least some embodiments, the forming of the transparent conductive pattern layer may comprise: forming a transparent conductive material layer on the transparent substrate; and etching the transparent conductive material layer to form the transparent conductive pattern layer.

In at least some embodiments, the forming of the transparent conductive material layer may comprise forming the transparent conductive material layer by evaporation.

In at least some embodiments, the etching of the transparent conductive material layer may comprise etching the transparent conductive material layer by lithography etching.

In at least some embodiments, a material of the transparent conductive pattern layer may be indium tin oxide.

In at least some embodiments, a material of the first metal circuit or the second metal circuit may comprise gold, aluminum, copper, or an alloy thereof.

In at least some embodiments, a material of the insulating layer may comprise silicon oxide or nitride dioxide.

In at least some embodiments, the electrically connecting of the LED chip to the first metal circuit and the second metal circuit may comprise disposing the LED chip on the first metal circuit and the second metal circuit through a silver glue or an eutectic bonding.

In at least some embodiments, the electrically connecting of the LED chip to the first metal circuit and the second metal circuit may comprise electrically connecting the LED chip to an electrode extending from the first metal circuit and an electrode extending from the second metal circuit.

In at least some embodiments, the electrically connecting of the LED chip to the first metal circuit and the second metal circuit may be performed by flip chip.

BRIEF DESCRIPTION OF THE DRAWINGS

In order to make the above and other objects, features and advantages of the present invention more comprehensible, several embodiments accompanied with figures are described in detail below.

DETAILED DESCRIPTION OF EMBODIMENTS

FIGS. 1A-1D are schematic cross-sectional flowcharts illustrating a manufacturing process of a light-emitting (LED) diode according to an embodiment of the present invention.

Figure 1A:
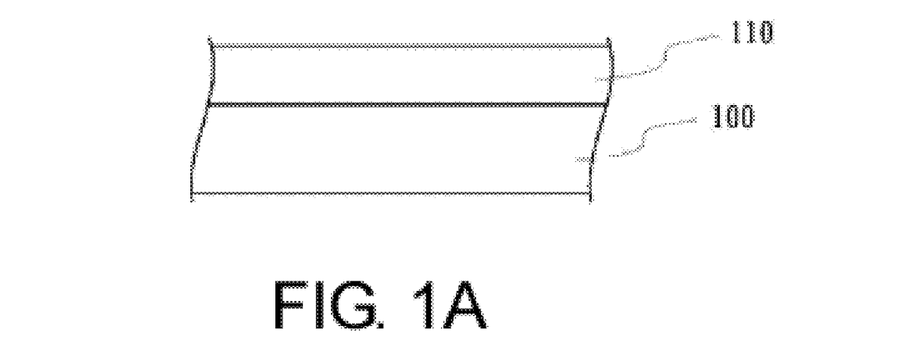
FIG. 1A is a schematic cross-sectional diagram showing a transparent conductive material layer formed on a transparent substrate according to one embodiment of the present invention.

First, as shown in FIG. 1A, a transparent substrate 100 whereon a transparent conductive material layer 110 has been formed is provided. A method of forming the transparent conductive material layer 110 is, for example, evaporation. A thickness of the transparent conductive material layer 110 can be between 1600~2100 angstrom (Å) and a resistance of the transparent conductive material layer 110 is 10 ohmic (Ω).

Figure 1B:
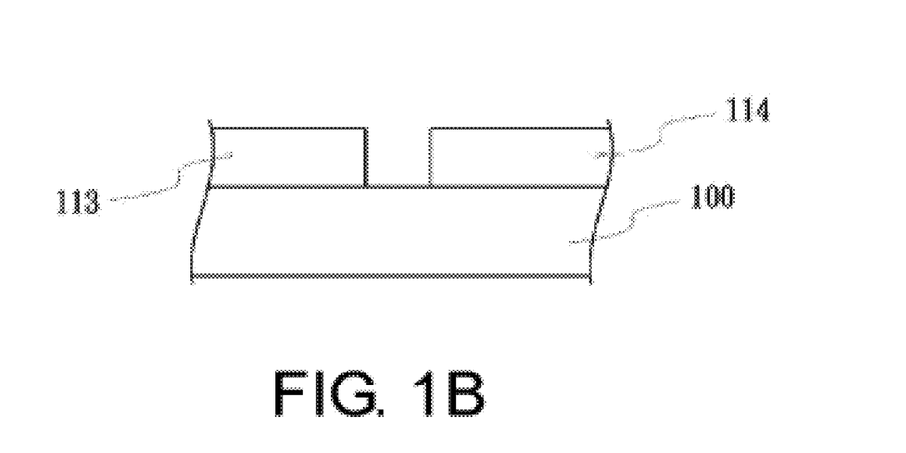
FIG. 1B is a schematic cross-sectional diagram showing a first transparent conductive layer and a second transparent conductive layer formed on the transparent conductive material layer depicted in FIG. 1A.

FIG. 1B is a schematic cross-sectional diagram showing a first transparent conductive layer and a second transparent conductive layer formed on the transparent conductive material layer depicted in FIG. 1A. The first transparent conductive layer 113 and the second transparent conductive layer 114 are formed through etching the transparent conductive material layer 110. The method for etching the transparent conductive material layer 110 is, for example, lithography etching.

Figure 1C:
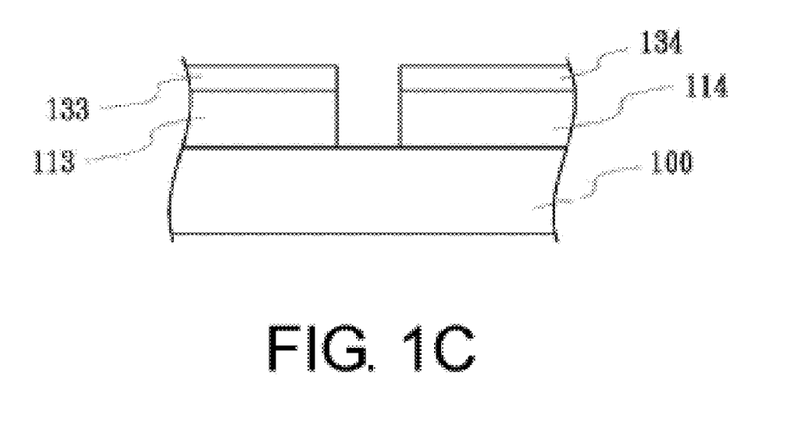
FIG. 1C is a schematic cross-sectional diagram showing the metal circuits deposited on the first transparent conductive layer and the second transparent conductive layer depicted in FIG. 1B.

FIG. 1C is a schematic cross-sectional diagram showing the metal circuits deposited on the first transparent conductive layer and the second transparent conductive layer depicted in FIG. 1B. The metal circuit 133 is deposited on a portion of the first transparent conductive layer 113, and the metal circuit 134 is deposited on a portion of the second transparent conductive layer 114.

Figure 1D:
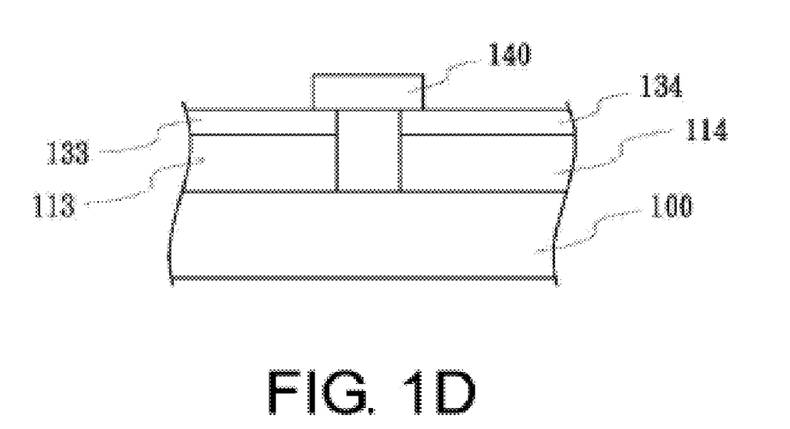
FIG. 1D is a schematic cross-sectional view of an LED chip disposed on the metal circuits depicted in FIG. 10.

FIG. 1D is a schematic cross-sectional view of an LED chip disposed on the metal circuits depicted in FIG. 10. The LED chip 140 is disposed on the first metal circuit 133 and the second metal circuit 134, so that the LED chip 140 is electrically connected to the first metal circuit 133 and the second metal circuit 134. The LED chip 140 is disposed on the metal circuit by flip chip, and the method of disposing includes fixing the LED chip 140 on the metal circuit through a silver glue of a eutectic bonding.

Figure 2:
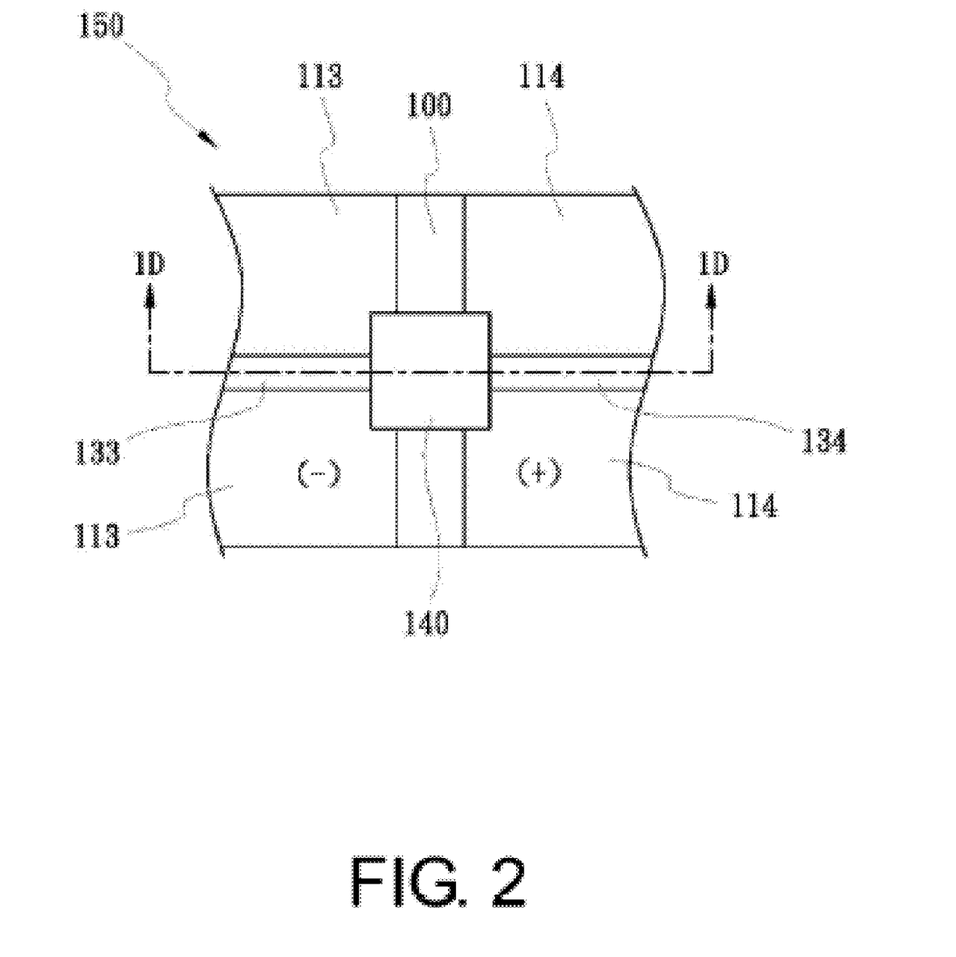
FIG. 2 is a top view schematically illustrating the LED chip depicted in FIG. 1D.

FIG. 2 is a top view schematically illustrating the LED chip depicted in FIG. 1D. The cross-sectional structure along line 1D in FIG. 2 is as shown in the FIG. 1D. The LED 150 includes a transparent substrate 100, a first transparent conductive layer 113, a second transparent conductive layer 114, a first metal circuit 133, a second metal circuit 134 and a LED chip 140.

The first transparent conductive layer 113 and the second transparent conductive layer 114 are respectively disposed on a region of the transparent substrate 100 and electrically isolated from each other. The first metal circuit 133 is disposed on the first transparent conductive layer 113 and covers a portion of the first transparent conductive layer 113. The second metal circuit 134 is disposed on the second transparent conductive layer 114 and covers a portion of the second transparent conductive layer 114. The LED chip 140 is disposed on the first metal circuit 133 and the second metal circuit 134 and electrically connected to the first metal circuit 133 and the second metal circuit 134. The LED chip 140 is suitable for emitting a light, and a portion of the light emits toward the transparent substrate.

According to an embodiment of the present invention, the substrate comprises a glass substrate, a plastic substrate or a flexible substrate. The thickness of the transparent substrate can be 1.1 micrometers (μm). The transparent conductive layer can be a conductive layer with indium tin oxide. The material of the metal circuit is, for example, gold, aluminum, copper, or alloy thereof.

FIGS. 3A-3F are schematic cross-sectional flowcharts illustrating a manufacturing process of a light-emitting diode (LED) according to another embodiment of the present invention.

Figure 3A:
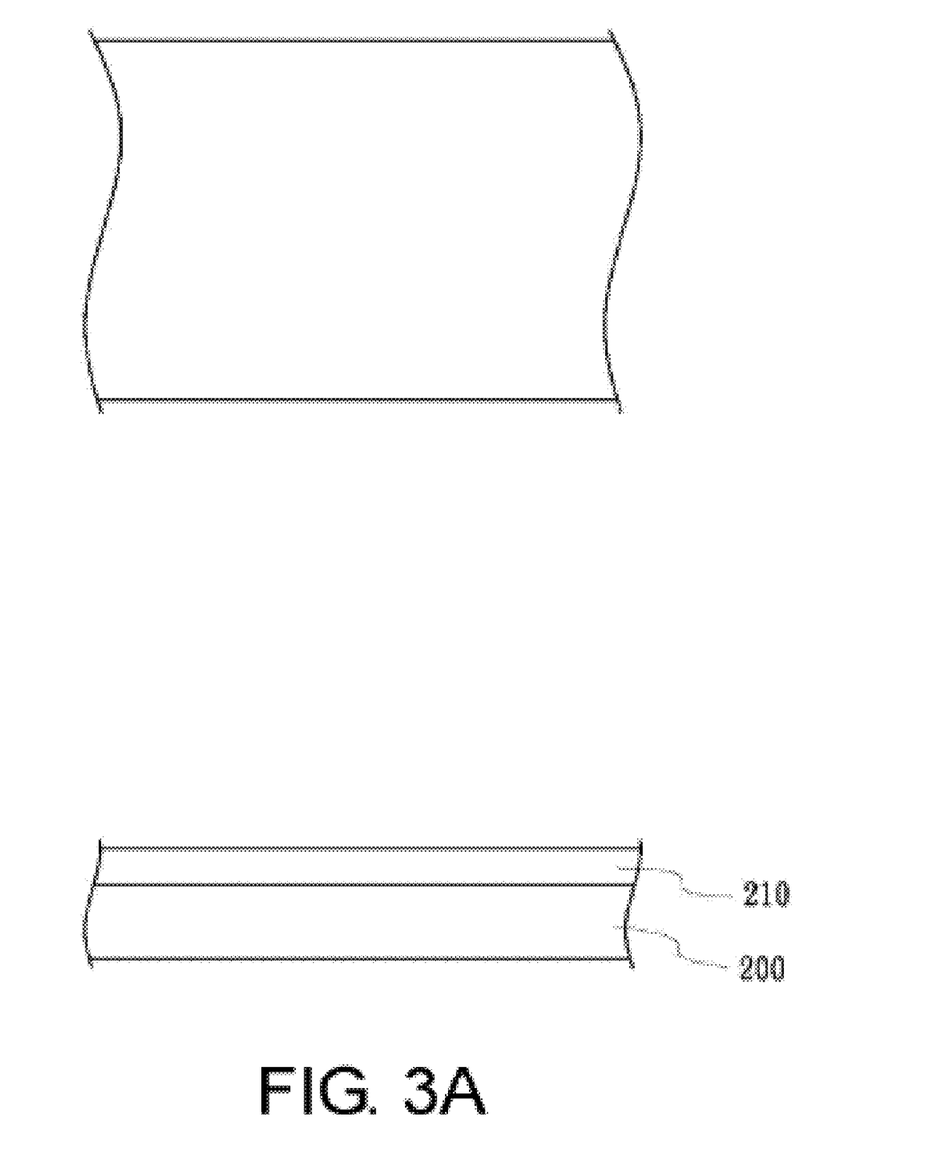
FIG. 3A is a schematic cross-sectional diagram showing a transparent conductive material layer formed on a transparent substrate according to another embodiment of the present invention.

FIG. 3A is a schematic cross-sectional diagram showing a transparent conductive material layer formed on a transparent substrate. A transparent conductive material 210 is plated on a transparent substrate 200. A method of forming the transparent conductive material 210 is, for example, evaporation. A thickness of the transparent conductive material 210 can be between 1600~2100 angstrom (Å) and a resistance of the transparent conductive material layer 210 is 10 ohmic (Ω).

Figure 3B:
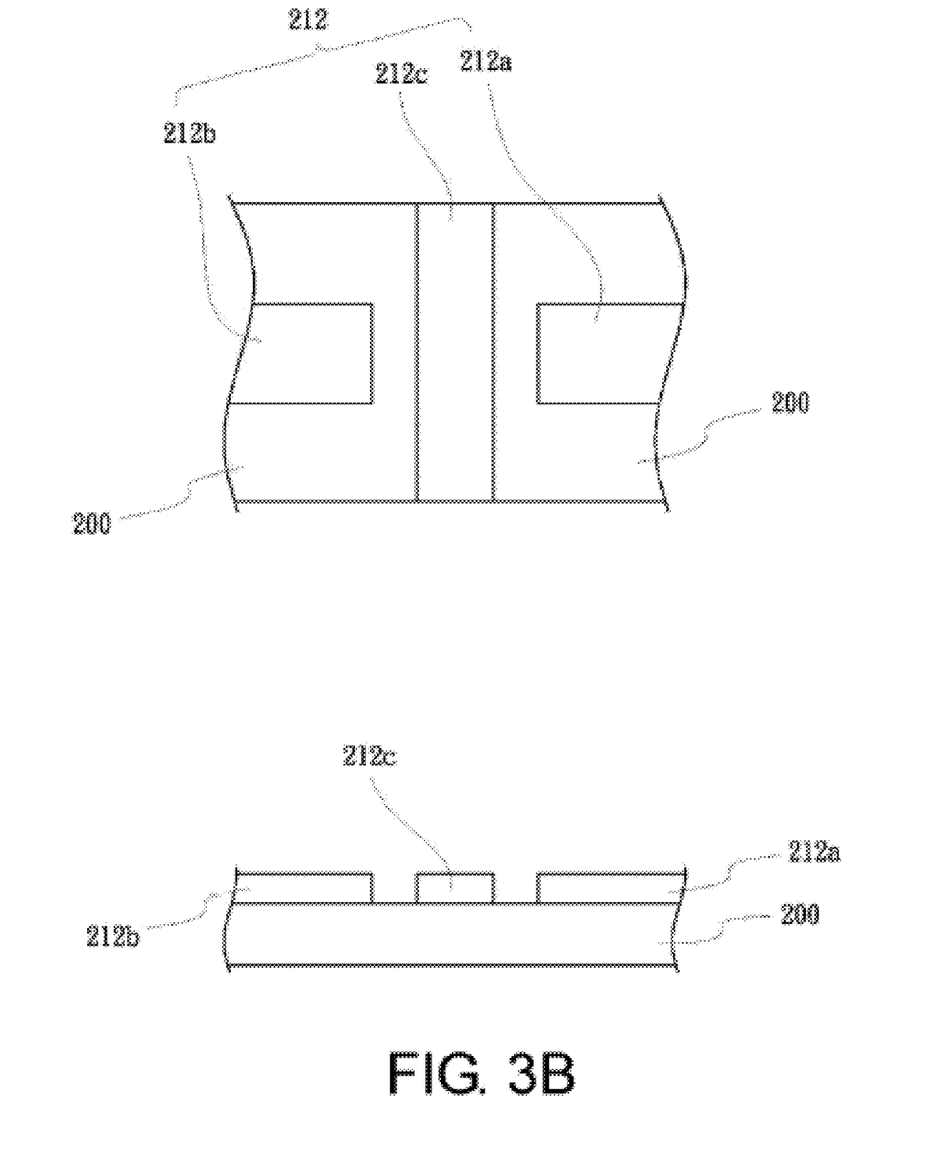
FIG. 3B is a schematic cross-sectional diagram showing a transparent conductive pattern formed on the transparent conductive material layer depicted in FIG. 3A.

FIG. 3B is a schematic cross-sectional diagram showing a transparent conductive pattern formed by etching the transparent conductive material layer 210. Patterns 212a, 212b, 212c are formed by etching the transparent conductive material layer 210. The method for etching the transparent conductive material layer 210 is, for example, lithography etching.

Figure 3C:
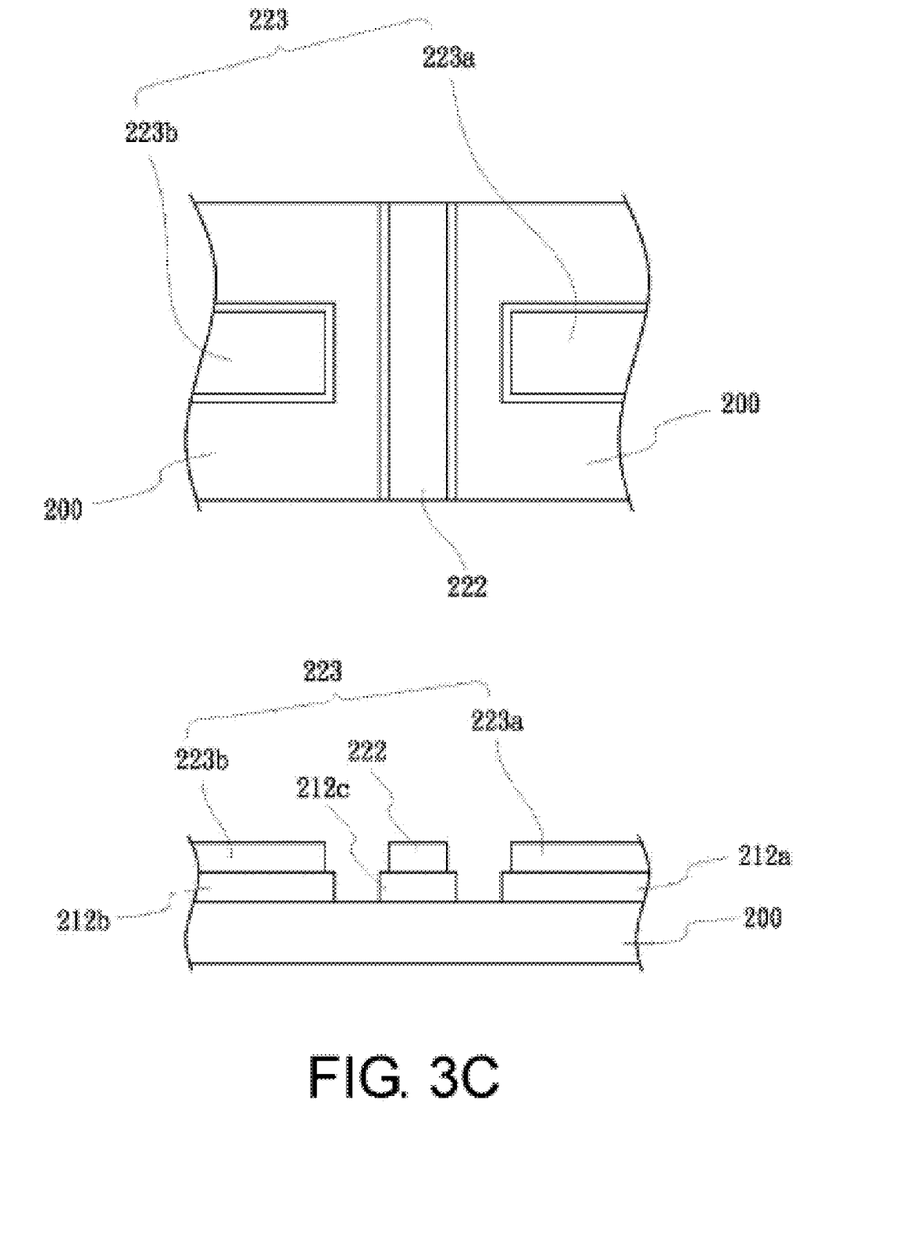
FIG. 3C is a schematic cross-sectional diagram showing the metal circuits deposited on the transparent conductive pattern depicted in FIG. 3B.

FIG. 3C is a schematic view of the metal circuits deposited on the transparent conductive pattern 212. The first metal circuit 222 is deposited on a portion of the pattern 212c of the transparent conductive pattern, the section 223a of the second metal circuit 223 is deposited on a portion of the pattern 212a, and the section 223b of the second metal circuit is deposited on a portion of the pattern 212b.

Figure 3D:
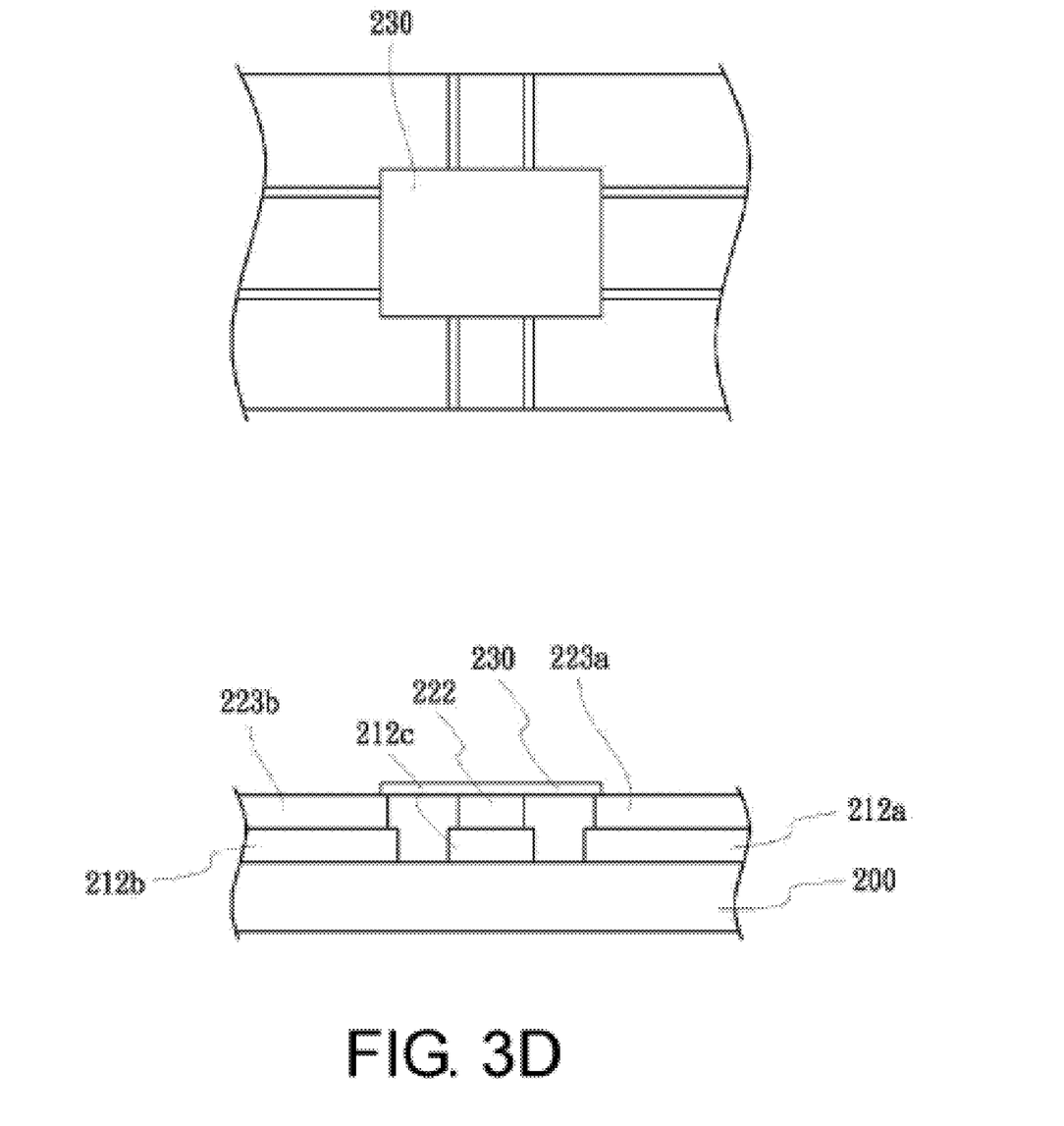
FIG. 3D is a schematic cross-sectional view of an insulating layer formed on the first metal circuit and the second metal circuit depicted in FIG. 3C.

FIG. 3D is a schematic view of an insulating layer formed on the first metal circuit 222. The insulating layer 230 covers a portion of the first metal circuit 222 and is extended to cover a portion of the sections 223a, 223b of the second metal circuit 223.

Figure 3E:
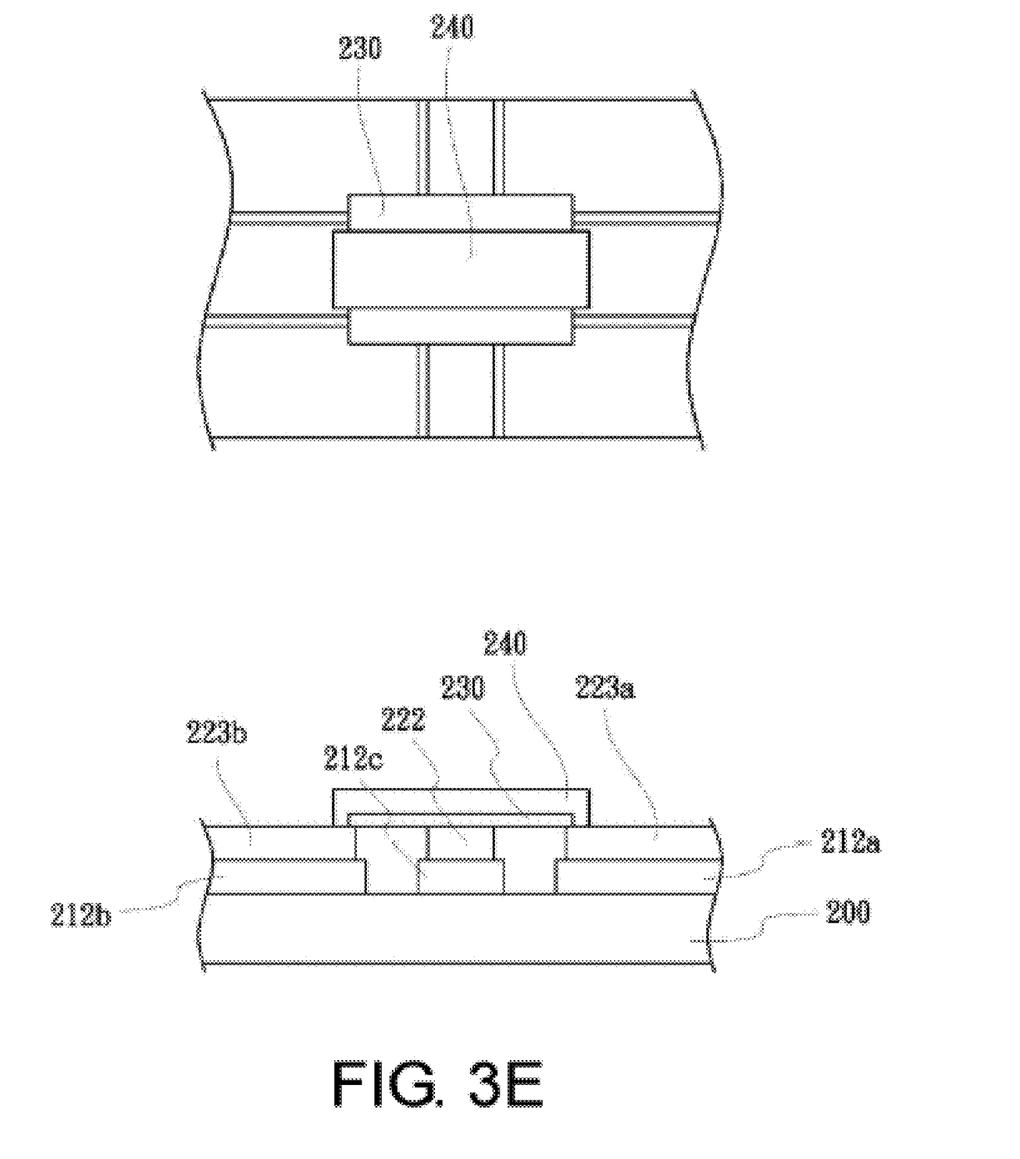
FIG. 3E is a schematic cross-sectional view of a metal layer formed on the insulating layer depicted in FIG. 3D to connect the different sections of the second metal circuit.

FIG. 3E is a schematic view of a metal layer formed on the insulating layer to connect the sections 223a, 223b of the second metal circuit 223. A metal layer is deposited on a portion of the insulating layer 230, the sections 223a, and 223b of the second metal circuit 223 to form a connecting section 240 to connect the sections 223a, 223b of the second metal circuit 223. The first metal circuit 222 and the second metal circuit 223 on the transparent conductive pattern layer intersect with each other by the connecting section 240. The insulating layer 230 is disposed between the first metal circuit 222 and the second metal circuit 223 to electrically isolate the first metal circuit 222 and the second metal circuit 223.

Figure 3F:
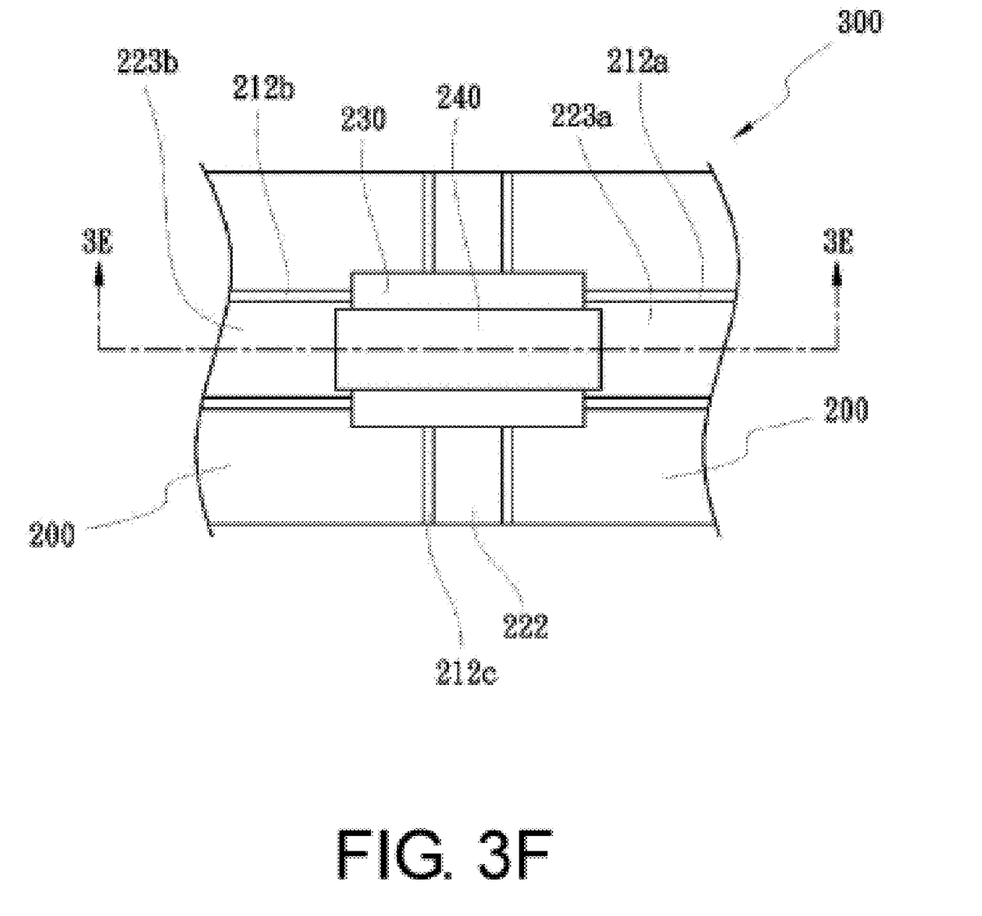
FIG. 3F is a schematic cross-sectional view of an LED chip disposed on the first metal circuit and the second metal circuit depicted in FIG. 3E.

FIG. 3F is a schematic view of an LED chip disposed on the first metal circuit and the second metal circuit. The first metal circuit 222 and the second metal circuit 223 respectively extend and connect to a positive electrode and a negative electrode, and the LED chip 140 is disposed on the positive electrode and the negative electrode so as to electrically connect to the first metal circuit 222 and the second metal circuit 223.

Figure 4:
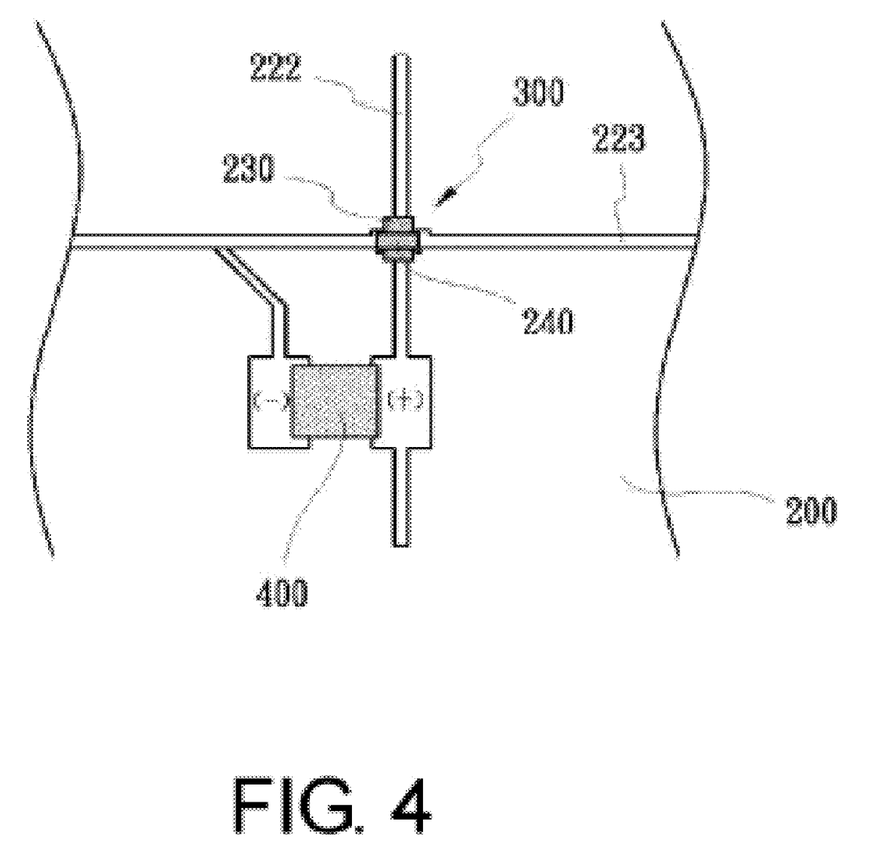
FIG. 4 is schematic views showing an intersection circuit according to the manufacturing flow charts depicted in FIG. 3A-3F.

FIG. 4 is schematic views showing an intersection circuit according to the manufacturing flow charts depicted in FIG. 3A-3F. The intersection circuit 300 includes a transparent substrate 200, a transparent conductive pattern layer 212, a first metal circuit 222 and a second metal circuit 223, an insulating layer 230 and a LED chip 400. The transparent conductive pattern layer 212 is disposed on the transparent substrate 200, and the first metal circuit 222 and the second metal circuit 223 on the transparent conductive pattern layer 212 intersect with each other. The insulating layer 230 is disposed between the second metal circuit 223 and the first metal circuit 222 to electrically isolate the first metal circuit 222 and the second metal circuit 223.

The LED chip 400 is disposed on the first metal circuit 222 and the second metal circuit 223 and electrically connected to the first metal circuit 222 and the second metal circuit 223. The LED chip 400 is disposed on the metal circuits by flip chip, and the method of disposing includes fixing the light emitting chip on the metal circuit through a silver glue of a eutectic bonding. The LED chip 400 is suitable for emitting a light, and a portion of the light emits toward the transparent substrate.

According to an embodiment of the present invention, the substrate comprises a glass substrate, a plastic substrate or a flexible substrate. The thickness of the transparent substrate can be 1.1 micrometers (μm). The transparent conductive layer can be a conductive layer with indium tin oxide. The material of the metal circuit is, for example, gold, aluminum, copper, or alloy thereof. A material of the insulating layer is, for example, silicon oxide, nitride dioxide or a common-used insulating material.

It should be noted that the above-mentioned first metal circuit, the second metal circuit, the insulating layer, the metal circuit pattern or the shape, the position, the size and the amount, the located of the positive electrode and the negative electrode of light emitting chip only serves as an example and is not intended to limit the present invention.

Although the present invention has been disclosed above by the embodiments, they are not intended to limit the present invention. Anybody skilled in the art can make some modifications and alterations without departing from the spirit and scope of the present invention. Therefore, the protecting range of the present invention falls in the appended claims.

What is claimed is:

1. A light emitting diode (LED) device, comprising:
   a transparent substrate;
   a transparent conductive pattern layer disposed on the transparent substrate;
   a first metal circuit and a second metal circuit disposed on the transparent conductive pattern layer and intersecting with each other, wherein the second metal circuit is discontinuous from the first metal circuit, and wherein the second metal circuit and the first metal circuit are electrically isolated from each other;
   an insulating layer disposed on a portion of the first metal circuit and extended to cover a portion of the second metal circuit;
   a connecting section disposed on a portion of the insulating layer and connected to the second metal circuit; and
   an LED chip electrically connected to the first metal circuit and the second metal circuit, the LED chip configured to emit a light at least a portion of which toward the transparent substrate.

2. The LED device of claim 1, wherein the transparent substrate comprises a glass substrate, a plastic substrate, or a flexible substrate.

3. The LED device of claim 1, wherein a material of the transparent conductive pattern layer comprises indium tin oxide.

4. The LED device of claim 1, wherein a material of the first metal circuit or the second metal circuit comprises gold, aluminum, copper, or an alloy thereof.

5. The LED device of claim 1, wherein a material of the insulating layer comprises silicon oxide or nitride dioxide.

6. The LED device of claim 1, wherein the LED chip is electrically connected to an electrode extending from the first metal circuit and an electrode extending from the second metal circuit.

7. The LED device of claim 1, wherein the LED chip is electrically connected to the first metal circuit and the second metal circuit by flip chip.

8. A manufacturing method of a light emitting diode (LED), comprising:
   forming a transparent conductive pattern layer on a transparent substrate;
   forming a first metal circuit and a second circuit on the transparent conductive pattern layer such that the second metal circuit and the first metal circuit intersect with each other and are electrically isolated from each other, wherein the second metal circuit is discontinuous from the first metal circuit;
   depositing an insulating layer on a portion of the first metal circuit, which extends to cover a portion of the second metal circuit;
   depositing a connecting section on a portion of the insulating layer and connected to the second metal circuit; and
   electrically connecting a LED chip to the first metal circuit and the second metal circuit.

9. The manufacturing method of claim 8, wherein the forming of the transparent conductive pattern layer comprises:
   forming a transparent conductive material layer on the transparent substrate; and etching the transparent conductive material layer to form the transparent conductive pattern layer.

10. The manufacturing method of claim 9, wherein the forming of the transparent conductive material layer comprises forming the transparent conductive material layer by evaporation.

11. The manufacturing method of claim 9, wherein the etching of the transparent conductive material layer comprises etching the transparent conductive material layer by lithography etching.

12. The manufacturing method of claim 8, wherein a material of the transparent conductive pattern layer is indium tin oxide.

13. The manufacturing method of claim 8, wherein a material of the first metal circuit or the second metal circuit comprises gold, aluminum, copper, or an alloy thereof.

14. The manufacturing method of claim 8, wherein a material of the insulating layer comprises silicon oxide or nitride dioxide.

15. The manufacturing method of claim 8, wherein the electrically connecting of the LED chip to the first metal circuit and the second metal circuit comprises disposing the LED chip on the first metal circuit and the second metal circuit through a silver glue or an eutectic bonding.

16. The manufacturing method of claim 8, wherein the electrically connecting of the LED chip to the first metal circuit and the second metal circuit comprises electrically connecting the LED chip to an electrode extending from the first metal circuit and an electrode extending from the second metal circuit.

17. The manufacturing method of claim 8, wherein the electrically connecting of the LED chip to the first metal circuit and the second metal circuit is performed by flip chip.

* * * * *